(12) United States Patent
Van Riesen et al.

(10) Patent No.: US 9,059,365 B2
(45) Date of Patent: Jun. 16, 2015

(54) SOLAR CELL CHIPS WITH NEW GEOMETRY AND METHOD FOR MANUFACTURING THE SAME

(75) Inventors: Sascha Van Riesen, Freiburg (DE); Andreas Gombert, Freiburg (DE)

(73) Assignee: Concentrix Solar GmbH, Freiburg (DE)

( * ) Notice: Subject to any disclaimer, the term of this patent is extended or adjusted under 35 U.S.C. 154(b) by 1171 days.

(21) Appl. No.: 13/054,482

(22) PCT Filed: Jul. 16, 2009

(86) PCT No.: PCT/EP2009/005189
§ 371 (c)(1),
(2), (4) Date: Jun. 27, 2011

(87) PCT Pub. No.: WO2010/006798
PCT Pub. Date: Jan. 21, 2010

(65) Prior Publication Data
US 2011/0247672 A1    Oct. 13, 2011

(30) Foreign Application Priority Data
Jul. 16, 2008  (DE) .......................... 10 2008 033 352

(51) Int. Cl.
*H01L 31/18* (2006.01)
*B23K 26/40* (2014.01)
*H01L 31/0352* (2006.01)
*H01L 31/0475* (2014.01)

(52) U.S. Cl.
CPC ............ *H01L 31/18* (2013.01); *B23K 26/4075* (2013.01); *H01L 31/035281* (2013.01); *Y02E 10/50* (2013.01); *H01L 31/0475* (2014.12)

(58) Field of Classification Search
CPC ......... H01L 21/00; H01L 27/00; H01L 31/00; B23K 26/00
USPC .................... 438/68, 98, 113, 460, 463, 940; 219/121.6, 121.79, 121.85; 136/252
See application file for complete search history.

(56) References Cited

U.S. PATENT DOCUMENTS 6,030,885 A    2/2000  Bothra
6,521,513 B1 *  2/2003  Lebens et al. ................. 438/462
(Continued)

FOREIGN PATENT DOCUMENTS

GB            79 21 644      1/1980
KR    10-2007-0037353      4/2007

OTHER PUBLICATIONS

Korean Office Action mailed on Apr. 5, 2012 for Korean Patent Application No. 10-2011-7003286.
(Continued)

*Primary Examiner* — Samuel M Heinrich
(74) *Attorney, Agent, or Firm* — Dorsey & Whitney LLP

(57) ABSTRACT

A method for manufacturing solar cell chips having an active surface area configured to directly convert solar energy into electrical energy. The method including cutting the solar cell chips out of a wafer using a laser such that the solar cell chips include a non-rectangular geometry. The non-rectangular geometry facilitate continuous cutting by the laser and maximizing a number of solar cell chips cut from the wafer.

25 Claims, 4 Drawing Sheets

(56) References Cited

U.S. PATENT DOCUMENTS

| | | | |
|---|---|---|---|
| 6,573,156 B1 * | 6/2003 | Wang et al. | 438/460 |
| 6,890,836 B2 * | 5/2005 | Howard et al. | 438/460 |
| 2002/0050489 A1 | 5/2002 | Ikegami | |
| 2002/0113242 A1 * | 8/2002 | Watanabe et al. | 257/82 |
| 2006/0134885 A1 * | 6/2006 | Yamazaki et al. | 438/460 |

OTHER PUBLICATIONS

Aiken et al., "Bringing III-V Multijunctions Down to Earth: Strategies for Successful Commercialization of Terrestrial Concentrator Solar Cells," $22^{nd}$ European Photovoltaic Solar Energy Conference, pp. 794-798, Sep. 3-7, 2007, Milan, Italy.

\* cited by examiner

“SOLAR CELL CHIPS WITH NEW GEOMETRY AND METHOD FOR MANUFACTURING THE SAME”

CROSS-REFERENCE TO PRIOR APPLICATIONS

This application is the U.S. National Stage Application of International Application No. PCT/EP2009/005189, filed on Jul. 16, 2009, which was published as WO 2010/006798 on Jan. 21, 2010, and claims priority to German Patent Application No. 10 2008 033 352.2, filed on Jul. 16, 2008. The disclosures of the above-referenced applications are incorporated by reference herein in their entireties.

FIELD

The present disclosure relates to manufacturing solar cell chips, such as with a new geometry for concentrator applications and a method for manufacturing such solar cell chips, and more specifically to a geometry of solar cell chips that can be selected such that a continuous cutting process using a laser can be used for separating the chips from the wafer.

BACKGROUND

In concentrator photovoltaics (CPV), the directly incident solar radiation is typically focused onto a solar cell by concentrator optics, such that the intensity of irradiation on the cell is higher by the so-called concentration factor. There are several optical approaches to concentrator optics, which are usually based on refraction, reflection or total internal reflection at specifically shaped optical components (P. Benitez and J. C. Minano, "Concentrator optics for the next-generation photovoltaics", in A. Marti and A. Luque (Ed.), "Next Generation Photovoltaics", Institute of Physics Publishing, Series in Optics and Optoelectronics, Bristol and Philadelphia, ISBN 0750309059, 2004). With highly concentrating systems, i.e. with a concentration factor>50, it is also common to effect optical concentration in two stages, by a primary and a secondary concentrator. The secondary concentrator in turn typically includes various features utilizing the above mentioned optical effects. It can serve to increase the concentration, to enlarge the angular range at which the solar cell receives radiation and to distribute it more homogenously over the cell area. In homogenization, it is also possible to influence the cross-section of the ray beam. In particular, those solar cells that are highly efficient may be suited as thereby the technical requirements for optical concentration and for the linked tracking of the system can be justified. These can be high-efficient Si solar cells, e.g., back-contact solar cells, but also monolithically interconnected stacked solar cells on the basis of III-V semiconductor materials (e.g., multi-junction cells, MJC). Multilayer structures of III-V-compound semiconductors are typically grown epitaxially. A typical structure of a triple cell includes a germanium basic cell, a GAInAs center cell and a GaInP top cell. Germanium wafers are the substrates onto which the thin III-V semiconductor layers are typically deposited. The basic material as well as the manufacture of MJC can be cost-intensive, which is why it is generally assumed that a very high concentration, i.e. small cell areas based on the solar aperture, are preferable for the cost effectiveness of the CPV (C. Algora, "The importance of the very high concentration in third-generation solar cells", in A. Marti and A: Luque (Ed.), "Next Generation Photovoltaics", Institute of Physics Publishing, Series in Optics and Optoelectronics, Bristol and Philadelphia, ISBN 0750309059, 2004).

Here, a problem can be utilizing, as efficiently as possible, cost-intensive wafers with very high-efficient solar cells for concentrator photovoltaics to permit an economical utilization of this technology.

Existing technology typically provides for processing the high-efficient solar cells on wafers and subsequently separating them into rectangular, in most cases square, chips by sawing. The individual chips then typically have edge lengths of 1 to 10 mm.

Many of the employed optical primary concentrators generate a largely rotationally symmetric focus. Without a secondary concentrator, the usable active area of the concentrator solar cells is therefore also rotationally symmetric. The corners of the cell, which is in this case square are used as bonding areas for the electrical interconnection of the cell. However, the use of the expensive wafer material with a rectangular, in particular, square geometry and a circular active cell area is altogether not satisfactory. Including area loss by saw cutting and the wafer edge, hardly more than 60% of the wafer area can be utilized as active solar cell area. With cell sizes below 2 mm, the usable area is typically drastically reduced due to cutting waste.

A secondary concentrator can distribute the radiation more homogenously onto a rectangular output face like a kaleidoscope by multiple reflection. Such secondary concentrators are described in literature (J. M. Gordon, "Concentrator optics", in A. Luque and V. Andreev (Eds.), Concentrator Photovoltaics, Springer Series in Optical Sciences 130, Springer-Verlag, Berlin Heidelberg (2007), and US 2008/0087323 A1), and can accordingly include a circular entrance and a nearly rectangular emergence surface or rectangular surfaces. However, these secondary concentrators are preferably lossless with a relatively high width-height ratio, i.e. they preferably include very high reflectance and, in case of massive systems, they are preferably made of a transparent material of very low absorption. Currently, such secondary concentrators are typically only manufactured at very high costs.

Currently, inexpensive solutions with high wafer utilization are not yet known.

SUMMARY

The present disclosure can provide a method for the manufacture of solar cell chips permitting better utilization of the wafer area, in particular when using secondary concentrators. The exemplary manufacturing process is preferably easy to handle and inexpensive.

BRIEF DESCRIPTION OF THE DRAWINGS

With reference to the following figures, the subject matter according to the present disclosure is to be illustrated more in detail without wanting to restrict the same to the exemplary embodiments shown herein.

DETAILED DESCRIPTION

Figure 1:
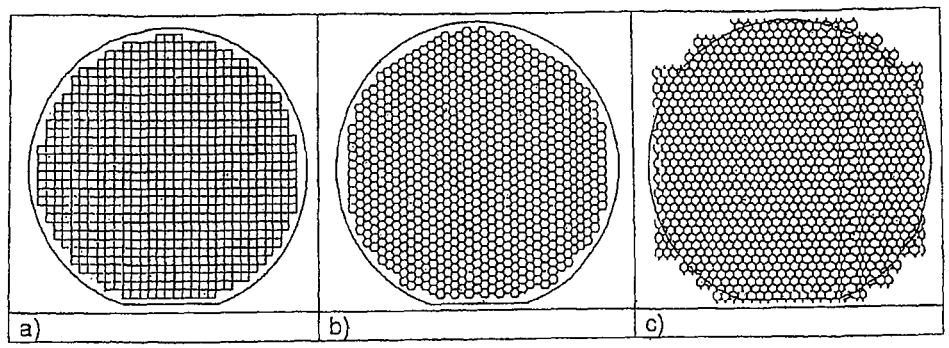
FIG. 1 shows two variants of solar cell chip geometries according to an embodiment of the present disclosure in comparison to known geometry.

According to an exemplary embodiment of the present disclosure, an exemplary method for the manufacture of solar cell chips can be provided, where the solar cells can include suited surface areas for the direct conversion of solar energy into electric energy. These will be referred to below as active areas of the solar cell chips.

The exemplary method according to an exemplary embodiment of the present disclosure can include solar cell chips being cut out of a wafer using a laser in a geometry deviating from the rectangular shape, such that the number of solar cell chips per wafer is increased as compared to rectangular solar cell chips. At the same time, the geometry of the solar cell chips can be selected such that a continuous cutting operation of the laser is permitted.

Preferably, the geometry of the active areas is adapted to be similar to the geometry of the solar cell chip. This is preferable so that electric bondings can be arranged outside the active areas of the solar cell chips, and simultaneously also realize a maximum proportion of active area per solar cell chip. Here, the active areas are preferably substantially circular, i.e. approximated to the circular shape, also including polygons with rounded corners. It is also possible for the geometry of the active areas to represent an elliptically deformed circular shape.

It is further preferable for the laser to be guided in the cutting operation such that the cut-out solar cell chip is substantially free from straight cutting edges, as they are known in sawing processes currently common.

An exemplary embodiment according to the present disclosure can provide the geometry of the solar cell chips to be substantially hexagonal. These in particular can include hexagonal geometries where the corners are rounded. In this exemplary embodiment, it is preferred for the active areas of the solar cell chips to include a transitional shape between a circular shape and a hexagonal shape. For example, the active areas can include an octagonal, decagonal or dodecagonal geometry, where the corners are rounded such that continuous laser guidance is permitted.

Another exemplary embodiment can provide for the laser to be guided linearly, where the movement of the laser alternates substantially sinusoidally, i.e., the laser can track the line in sinuous lines. Here, the lines can be tracked one after another by reversion, where the summits of the sinusoids tangentially touch each other in adjacent lines. This pattern then can result in solar cell chips which include a substantially circular geometry in the region of the active areas and a web-like extension at two opposite sides. The web-like extensions can then be utilized for electric bonding. These can have, e.g., elliptical shapes.

An aspect of the present disclosure can provide a shape where the active areas are arranged in a close packed crystal structure, based on the plane of the solar cell chips. The remaining gaps of the crystal structure can then be utilized as non-active areas for electric bonding. The utilization of the wafer surface may be optimal in this case.

According to another aspect of the present disclosure, the solar cell chips can include, aside from the active areas, also non-active or passive areas in which electric bondings can be arranged at least in sections. Preferably, these are two punctual bondings located on opposite sides of the active area.

The separation of the wafer into solar cell chips is preferably performed with a YAG laser, a fiber laser and/or a disk laser. The laser can be operated in a dry process. It is likewise possible for the laser to be coupled into a jet and guided via total reflection.

The cutting operation itself can be performed by a relative motion between waver and laser. This can be a movement of the wafer table, Flying Optics as laser, and/or the use of a laser scanner.

According to an exemplary embodiment of the present disclosure, a solar cell chip having an active surface area suited for the direct conversion of solar energy into electric energy can be provided, which can be manufactured according to the exemplary method described above.

Moreover, a solar cell module containing at least two and at most 2000 solar cell chips can be provided.

In FIG. 1a), a known geometry is shown in which the wafer is separated into a plurality of single chip squares by sawing. In FIG. 1b), an exemplary embodiment according to the present disclosure is shown in which the solar cell chips include a hexagonal arrangement. In this example, the number of chips on the wafer can be increased by approximately 16%. In FIG. 1c), a geometry which is based on the sinusoidal movement of the laser is shown, whereby continuous cutting paths are realized. Here, the number of chips to be arranged is similar to that of FIG. 1b).

The solar cells shown in FIGS. 1a)-c) can include additional strip conductors (e.g., so-called grid) arranged on the surface to discharge the charge carriers collected at the surface of a solar cell.

Figure 2:
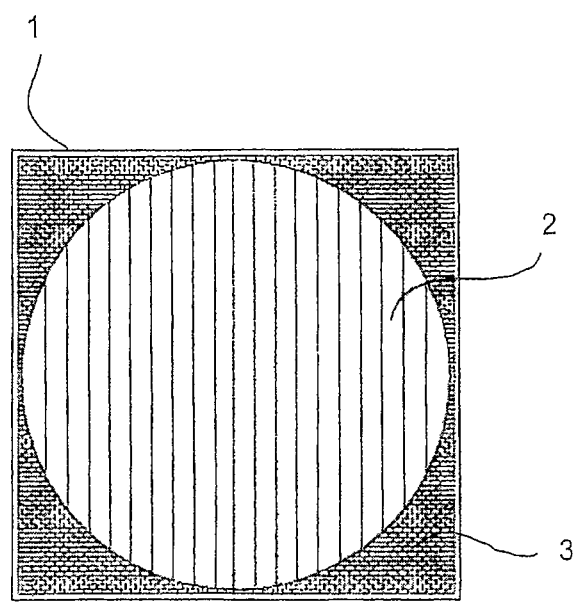
FIG. 2 shows a known solar cell chip geometry.

In FIG. 2, a known solar cell chip known with a corresponding design is shown. This is a square chip 1 which includes a centered active area 2. Furthermore, the chip includes non-active areas 3 where electric bonding can be realized.

Figure 3:
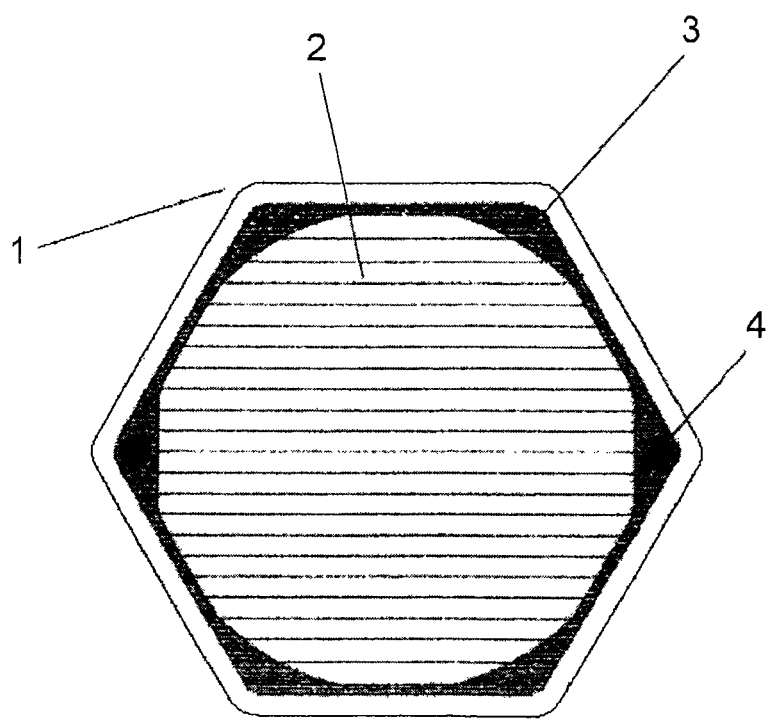
FIG. 3 shows a solar cell chip geometry according to an embodiment of the present disclosure.

In FIG. 3, a rounded hexagonal chip 1 according to another exemplary embodiment of the present disclosure is shown. This chip can include an active area 2, and its shape can be a combination of a polygon with twelve corners and a circle, i.e., the corners have been correspondingly rounded.

Furthermore, non-active areas 3 can be located on the chip. These can then be used, e.g., for electric bonding 4.

Figure 4:
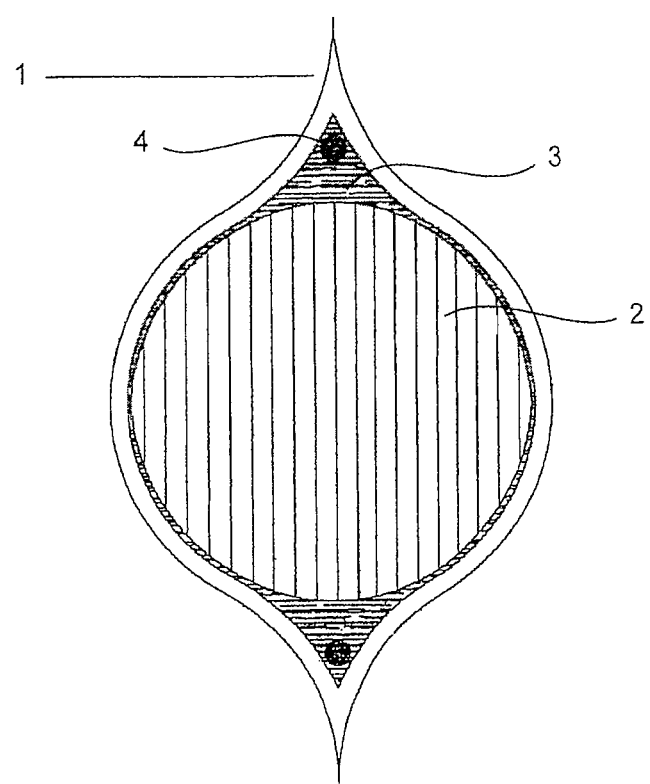
FIG. 4 shows another solar cell chip geometry according an embodiment of the present disclosure.

In FIG. 4, a solar cell chip with a drop-like geometry 1 according to another exemplary embodiment of the present disclosure is shown. In this embodiment, the laser can track the wafer linearly, where at the end of the line a transfer to the next line and a subsequent change of direction of the laser takes place. This, however, is preferably not a straight-line, but a sinusoidal movement of the laser. Tracking is effected such that the solar cell chip includes a substantially circular geometry in the region of the active surface and a web-like extension at two opposite sides. Then, an active area 2 is shown on the solar cell chip 1, which in this case is slightly deformed elliptically. Furthermore, the chip includes tapering, non-active areas 3 where electric bondings 4 can be arranged. This geometry is suited for the use of reflective or massive secondary optics as the distance between the electric terminal areas and the active cell area is comparatively long.

While an illustrative embodiment of the invention has been disclosed herein, it will be appreciated that numerous modifications and other embodiments may be devised by those skilled in the art. Therefore, it will be understood that the appended claims are intended to cover all such modifications and embodiments that come within the spirit and scope of the present invention.

The invention claimed is:

1. A method for manufacturing solar cell chips, each having an active surface area configured to directly convert solar energy into electrical energy, comprising cutting the solar cell chips out of a wafer using a laser drawn continuously about substantially an entire periphery of each chip, the periphery having a non-rectangular geometry configured to facilitate the continuous cutting by the laser and maximizing a number of solar cell chips cut from the wafer.

2. The method of claim 1, wherein the active surface area has a geometry similar to and disposed within the geometry of the solar cell chips.

3. The method of claim 1, wherein the active surface area has a shape that is one of substantially circular or substantially hexagonal.

4. The method of claim 3, wherein the substantially circular shape is substantially elliptical.

5. The method of claim 3, wherein the active surface area includes a transitional shape that is between a hexagonal and circular shape.

6. The method of claim 5, wherein the active surface area includes at least one of a octagonal, decagonal, or dodecagonal shape.

7. The method of claim 6, wherein the active surface area includes rounded corners.

8. The method of claim 1, wherein the laser is guided such that the solar cell chips are substantially free of straight cut edges.

9. The method of claim 1, wherein the laser is guided linearly with a substantially sinusoidal movement of the laser.

10. The method of claim 1, wherein the laser is guided such that the solar cell chips include a substantially circular geometry in a region of the active surface area and a web extension at two opposite ends of the solar cell chips.

11. The method of claim 1, wherein the active surface area is at least partially surrounded around a periphery of the active surface area by a non-active area.

12. The method of claim 1, wherein the laser is guided such that the active surface areas are arranged in a close packed crystal structure in a plane of the solar cell chips, and gaps within the crystal structure include non-active areas configured for electric bonding areas.

13. The method of claim 12, wherein the solar cell chips include an electric bonding area in at least some of the non-active areas.

14. The method of claim 13, wherein the electric bonding area includes first and second punctual bonding areas disposed at opposite sides of the active surface area.

15. The method of claim 1, wherein the laser includes at least one of a YAG laser, a fiber laser, or a disk laser.

16. The method of claim 1, wherein the laser is at least one of guided using a total reflection process or used within a dry process.

17. The method of claim 1, wherein the cutting includes causing relative movement between the wafer and the laser beam.

18. The method of claim 17, wherein causing the relative movement includes moving a wafer table that supports the wafer, moving a flying optics laser, or moving a laser scanner.

19. The method of claim 1, wherein the solar cell chips are cut out of the wafer using only laser cutting.

20. The method of claim 1, wherein the solar cell chips are cut out of the wafer without using a saw.

21. A solar cell chip comprising an active surface area configured to directly convert solar energy into electric energy manufactured according to the method of claim 1.

22. The solar cell chip of claim 21, wherein the solar cell chip is substantially free of straight cut edges.

23. The solar cell chip of claim 21, wherein the solar cell chip includes a substantially circular geometry in a region of the active surface area and a web-like extension at two opposite ends of the solar cell chip.

24. The solar cell chip of claim 21, wherein the solar cell chip includes an elliptic geometry.

25. A solar cell module, comprising at least two and at most about 2000 solar cell chips of claim 21.

* * * * *